(12) United States Patent
Cheng et al.

(10) Patent No.: US 11,251,400 B2
(45) Date of Patent: Feb. 15, 2022

(54) DISPLAY PANEL, DISPLAY MODULE, AND ELECTRONIC DEVICE HAVING MULTI-LEVEL BLOCKING STRUCTURES

(71) Applicant: WUHAN CHINA STAR OPTOELECTRONICS SEMICONDUCTOR DISPLAY TECHNOLOGY CO., LTD., Wuhan (CN)

(72) Inventors: Jiayou Cheng, Wuhan (CN); Donghwan Kim, Wuhan (CN); Chienlin Wu, Wuhan (CN)

( * ) Notice: Subject to any disclaimer, the term of this patent is extended or adjusted under 35 U.S.C. 154(b) by 197 days.

(21) Appl. No.: 16/496,460

(22) PCT Filed: May 21, 2019

(86) PCT No.: PCT/CN2019/087795
§ 371 (c)(1),
(2) Date: Sep. 23, 2019

(87) PCT Pub. No.: WO2020/224009
PCT Pub. Date: Nov. 12, 2020

(65) Prior Publication Data
US 2021/0242422 A1  Aug. 5, 2021

(30) Foreign Application Priority Data

May 7, 2019  (CN) .......................... 201910373703.1

(51) Int. Cl.
*H01L 51/52* (2006.01)
*H01L 27/32* (2006.01)
(Continued)

(52) U.S. Cl.
CPC ...... *H01L 51/5253* (2013.01); *H01L 27/3246* (2013.01); *H01L 27/3283* (2013.01);
(Continued)

(58) Field of Classification Search
CPC ............. H01L 51/5253; H01L 27/3246; H01L 27/3283; H01L 27/3295; H01L 33/52; H01L 33/54; H01L 33/56
See application file for complete search history.

(56) References Cited

U.S. PATENT DOCUMENTS 10,135,020 B1* 11/2018 Zhang ................. H01L 27/3225
10,276,831 B2* 4/2019 Lee ..................... H01L 27/3246
(Continued)

FOREIGN PATENT DOCUMENTS

CN         1852625 A     10/2006
CN       105280677 A      1/2016
(Continued)

*Primary Examiner* — Ida M Soward

(57) ABSTRACT

The present invention provides a display panel, a display module, and an electronic device. The display panel includes at least one blocking portion. Each blocking portion has a first sub-blocking portion, at least one second sub-blocking portion, and at least one blocking unit. The at least one second sub-blocking portion partially covers the first sub-blocking portion. The blocking unit partially cover the corresponding second sub-blocking portion. A gap between tops of each two adjacent third sub-blocking portions is smaller than a gap between bottoms of each two adjacent third sub-blocking portions.

20 Claims, 3 Drawing Sheets

(51) Int. Cl.
*H01L 33/52* (2010.01)
*H01L 33/54* (2010.01)
*H01L 33/56* (2010.01)

(52) U.S. Cl.
CPC .............. *H01L 33/52* (2013.01); *H01L 33/54* (2013.01); *H01L 33/56* (2013.01)

(56) References Cited

U.S. PATENT DOCUMENTS

| | | | | |
|---|---|---|---|---|
| 10,446,793 | B2* | 10/2019 | Kim | H01L 27/3276 |
| 10,451,940 | B2* | 10/2019 | Park | H01L 51/0097 |
| 10,468,628 | B2* | 11/2019 | Kim | H01L 27/3276 |
| 10,490,773 | B2* | 11/2019 | Kim | H01L 27/124 |
| 10,504,978 | B2* | 12/2019 | Lee | H01L 51/5056 |
| 10,608,062 | B2* | 3/2020 | Takahashi | H05B 33/04 |
| 10,707,282 | B1* | 7/2020 | Yang | H01L 51/5256 |
| 10,727,424 | B2* | 7/2020 | Tanaka | H01L 27/3276 |
| 11,049,927 | B2* | 6/2021 | Kim | H01L 27/3276 |
| 2015/0380685 | A1 | 12/2015 | Lee et al. | |
| 2017/0149017 | A1 | 5/2017 | Lee et al. | |
| 2018/0097200 | A1* | 4/2018 | Park | H01L 27/3246 |
| 2018/0108867 | A1 | 4/2018 | Lee et al. | |
| 2018/0190724 | A1* | 7/2018 | Kang | G06F 3/0446 |
| 2020/0091459 | A1* | 3/2020 | Senoo | H01L 27/3258 |
| 2020/0212353 | A1* | 7/2020 | Kim | H01L 27/3246 |
| 2020/0274094 | A1* | 8/2020 | Zheng | H01L 51/5246 |
| 2021/0005841 | A1* | 1/2021 | Ohta | H01L 51/5246 |
| 2021/0143238 | A1* | 5/2021 | Kim | H01L 51/5246 |
| 2021/0159453 | A1* | 5/2021 | Takahashi | G09F 9/30 |

FOREIGN PATENT DOCUMENTS

| | | | | |
|---|---|---|---|---|
| CN | 107819014 A | | 3/2018 | |
| CN | 109585690 A | | 4/2019 | |
| CN | 109616580 A | | 4/2019 | |
| WO | WO-2019085108 A1 * | | 5/2019 | ......... H01L 27/3246 |

* cited by examiner

DISPLAY PANEL, DISPLAY MODULE, AND ELECTRONIC DEVICE HAVING MULTI-LEVEL BLOCKING STRUCTURES

1. Field of Disclosure

The present invention relates to a field of display devices and in particular, to a display panel, a display module, and an electronic device.

2. Description of Related Art

Compared with conventional liquid crystal display panels, organic light-emitting diodes (OLEDs) have many advantages such as self-illumination, wide viewing angles, high contrast, fast response times, and being light, thin, and flexible, and thus are used extensively. However, since the OLED is very sensitive to oxygen and moisture, a product life-span is reduced when oxygen and moisture penetrate into an OLED device. Therefore, the OLED display panel needs to have an encapsulating structure to be isolated from moisture and oxygen.

Due to a trend of being bendable, foldable, and curvable, encapsulating methods mostly are thin-film encapsulating methods. Common thin-film encapsulating methods adopt an inorganic-organic alternating configuration, in which an organic layer is usually made by ink jet printing (IJP). However, an overflowing problem easily occurs during a manufacturing process. Therefore, it is necessary to provide a blocking portion (Dam) outside the organic layer for a blocking purpose. A common dam structure is formed by coating, exposure, and development, but a conventional blocking portion fails to provide a good blocking effect, especially for an organic material with low viscosity. This causes more overflow of the organic material, compromises an encapsulating effect, and shortens a product lifespan of the display panel.

SUMMARY

It is an objective for the present invention to provide a display panel, a display module, and an electronic device, whereby an encapsulating effect is improved, and a product lifespan of the display panel is prolonged.

Accordingly, the present invention provides a display panel, comprising:
 at least one blocking portion, the at least one blocking portion surrounding a display region, a cross-section of the blocking portion comprising:
  a first sub-blocking portion;
  at least one second sub-blocking portion, the at least one second sub-blocking portion disposed on the first sub-blocking portion, the at least one second sub-blocking portion partially covering the first sub-blocking portion; and
  at least one blocking unit, the blocking unit disposed on the second sub-blocking portion, the blocking unit comprising at least two third sub-blocking portions, the blocking unit disposed corresponding to the second sub-blocking portion, the blocking unit partially covering the corresponding second sub-blocking portion, a gap between tops of each two adjacent third sub-blocking portions is smaller than a gap between bottoms of each two adjacent third sub-blocking portions.

The present invention further provides a display module which comprises the above-mentioned display panel.

The present invention further provides an electronic device which comprises the above-mentioned display module.

The present invention provides a display panel, a display module, and an electronic device. The present invention comprises at least one blocking portion. A cross-section of the blocking portion comprises: a first sub-blocking portion; at least one second sub-blocking portion, the at least one second sub-blocking portion being disposed on the first sub-blocking portion, the second sub-blocking portion partially covering the first sub-blocking portion; at least one blocking unit, the blocking unit being disposed on the corresponding second sub-blocking portion, the blocking unit comprising at least two third sub-blocking portions, the blocking unit being disposed on the corresponding second sub-blocking portion, wherein the blocking unit partially covers the corresponding second sub-blocking portion, and a gap between tops of each two adjacent third sub-blocking portions is smaller than a gap between bottoms of each two adjacent third sub-blocking portions, so that a gap at a top of the blocking portion of the present invention is small, and thereby overflowing of an organic layer can be effectively prevented, an encapsulating effect is improved, and a product lifespan of the display panel is prolonged.

BRIEF DESCRIPTION OF DRAWINGS

The technical solutions and other advantageous effects of the present invention will be apparent from the following detailed description with reference to the accompanying drawings. In the drawings.

DETAILED DESCRIPTION OF EMBODIMENTS

Figure 1:
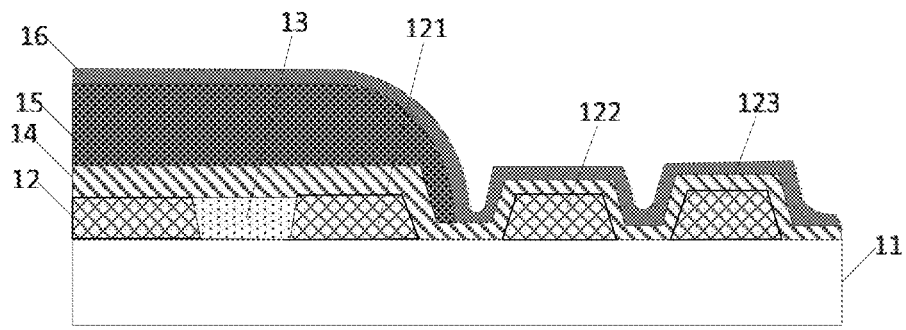
FIG. 1 is a schematic structural view of a conventional display panel.

Embodiments of the present invention are described in detail below and are illustrated in the accompanying drawings, wherein the same or similar reference numerals denote the same or similar elements or elements having the same or similar functions. The embodiments described below with reference to the accompanying drawings are intended to be illustrative and are not to be construed as limiting.

In the description of the present invention, it should be noted that, the terms such as "center", "longitudinal", "transverse", "length", "width", "thickness", "upper", "lower", "front", "rear", "left", "right", "vertical", "horizontal", "top", "bottom", "inside", "outside", "clockwise", and "counterclockwise" which indicate directions or position relationship with reference to the accompanying drawings are merely for ease of understanding and simplifying a description and are not intended to indicate or imply that a devices or component referred to has a specific orientation and is constructed and operated in a specific orientation. Therefore, it should not be construed as limiting the invention. Moreover, the terms "first" and "second" are illustrative only and are not to be construed as indicating or implying a relative importance or implicitly indicating the number of technical features indicated. Thus, features defined as "first" or "second" may include one or more of the described features either explicitly or implicitly. In the present invention, "multiple" means two or more, unless otherwise explicitly specified.

In the present disclosure, the terms "mounted", "connected", and "coupled" should be interpreted in a broad sense. For example, elements may be fixedly or detachably connected, integrally connected, mechanically connected, electrically connected, in communication with each other, directly connected, or indirectly connected through an intermediate medium. Alternatively, two elements may internally communicate with each other or interact with each other. Persons skilled in the art can understand the specific meanings of the above terms in the present invention on a case-by-case basis.

In the present invention, a first element "on" or "under" a second element may indicate that the first element is in direct contact with the second element, or the first element contacts the second element through another element. Moreover, the first element being "above", "on", or "over" the second element indicates that the first element is right above or obliquely over the second element, or merely indicates that the first element is positioned at a level higher than the second element. The first element being "below", "under" and "beneath" the second element may indicate that, the first element is right under or obliquely below the second element, or merely indicate that the first element is positioned at a level lower than the second element.

The below description provides many different embodiments or examples for implementing different structures of the present invention. In order to simplify the description of the present invention, components and configuration of specific examples are described below. Of course, they are merely examples and are not intended to limit the present invention. In addition, reference numerals and/or reference labels can be repeatedly used in various examples of the present invention for the purpose of simplicity and clarity, which does not indicate a relationship between various embodiments and/or configurations. Moreover, the present invention provides examples regarding various specific processes and materials, but a person of ordinary skill in the art will be aware of the use of other processes and/or the use of other materials.

Referring to FIG. 1, a conventional organic light emitting diode (OLED) display panel comprises a base substrate 11, a pixel defining layer 12, an organic light emitting layer 13, a first inorganic layer 14, an organic layer 15, and a second inorganic layer 16.

The base substrate 11 comprises a glass substrate, a switch array layer, and an anode.

The pixel defining layer 12 comprises two pixel defining units 121 spaced apart from each other, a first blocking portion 122, and a second blocking portion 123. The organic light emitting layer 14 is disposed in a gap between the adjacent two pixel defining units 121.

The first inorganic layer 14 is disposed on the pixel defining layer 12, the first blocking portion 122, and the second blocking portion 123. The organic layer 15 is disposed on a portion of the first inorganic layer 14. The second inorganic layer 16 is disposed on the organic layer 15.

Figure 2:
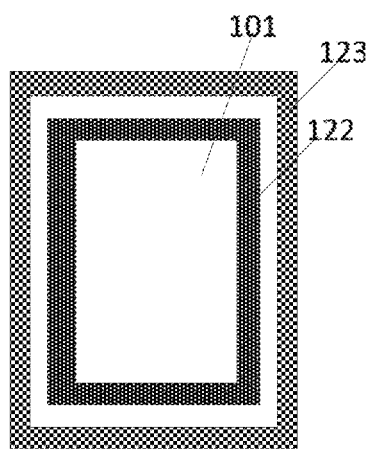
FIG. 2 is a top view of the conventional display panel.

Referring to FIG. 2 taken from top view, the first blocking portion 122 and the second blocking portion 123 both surround a display region 101.

Figure 3:
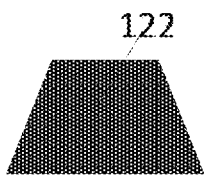
FIG. 3 is a first cross-sectional view of a conventional blocking portion.
Figure 4:
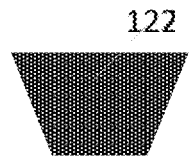
FIG. 4 is a second cross-sectional view of the conventional blocking portion.

Referring to FIG. 3, in one embodiment, a cross-section of the first blocking portion 122 has a trapezoidal shape, and is usually fabricated by coating, exposure, development, curing, etching, and etc. Usually, the first blocking portion 122 is made of polyimide (PI) or PI added with a water-absorbent material. As shown in FIG. 4, in another embodiment, the cross-section of the first blocking portion 122 can have an inverted trapezoidal shape, and a gap between tops of the inverted trapezoidal shapes is small, so the organic layer can be prevented from overflowing, and an encapsulating effect is improved.

Figure 5:
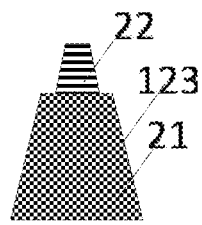
FIG. 5 is a third cross-sectional view of the conventional blocking portion.
Figure 6:
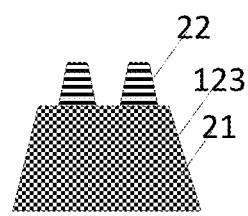
FIG. 6 is a fourth cross-sectional view of the conventional blocking portion.

As shown in FIG. 5, in one embodiment, the second blocking portion 123 is usually made of polyimide (PI). A cross-sectional structure of the second blocking portion 123 is a two-layered structure including a first sub-blocking portion 21 and a second sub-blocking portion 22. Both of the first sub-blocking portion 21 and the second sub-blocking portion 22 are made by manufacturing processes such as coating, exposure, development, curing, and etching, in which two exposures are required during the manufacturing processes. Alternatively, the manufacturing processes can be coating, exposure, and development, in which only one exposure is required by using a mask (Halftone) process. As shown in FIG. 6, in another embodiment, there are two second sub-blocking portions 22.

Referring to FIGS. 5 and 6, the cross-sections of the first sub-blocking portion 21 and the second sub-blocking portion 22 are both a trapezoidal shape. Since more second sub-blocking portions 22 are provided in the embodiment of FIG. 6, overflowing of the organic layer can be better prevented.

Figure 7:
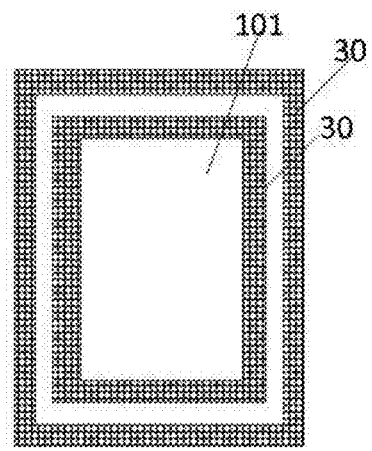
FIG. 7 is a top view of a display panel according to the present invention.
Figure 8:
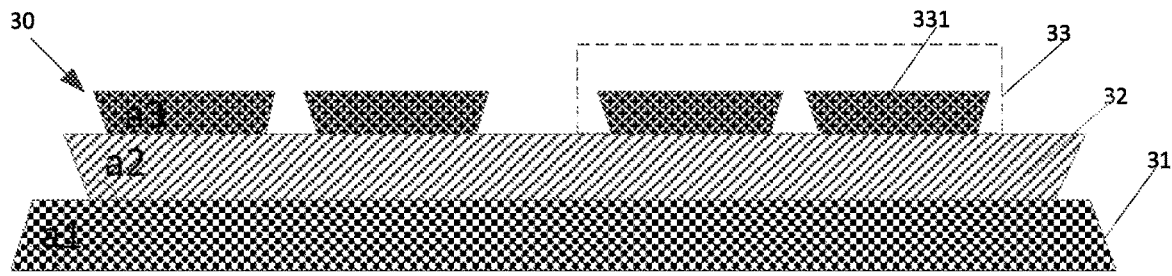
FIG. 8 is a first structural view of a blocking portion of the present invention.
Figure 9:
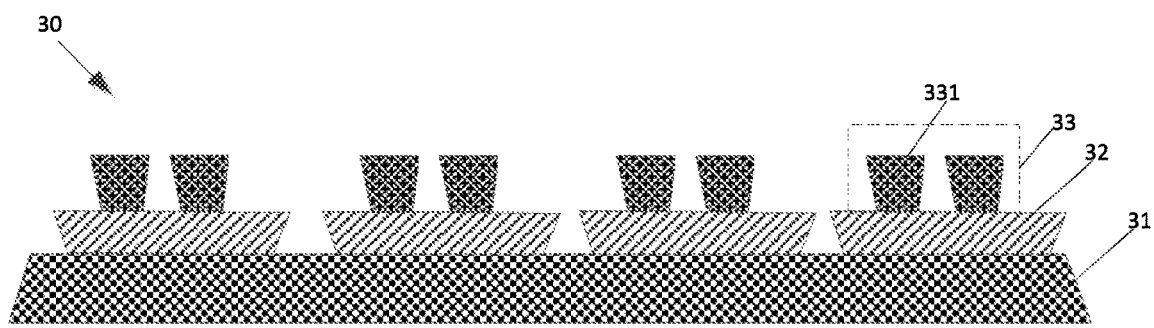
FIG. 9 is a second structural view of the blocking portion of the present invention.

Referring to FIGS. 7 to 9, FIG. 7 is a top view showing a display panel of the present invention.

As shown in FIG. 7, the display panel of the present invention is an OLED display panel. The OLED display panel comprises a display region 101 and two blocking portions 30. Each of the blocking portions 30 surrounds the display region 101.

Referring to FIG. 8, a cross-sectional structure of the blocking portion 30 comprises a first sub-blocking portion 31, a second sub-blocking portion 32, and two blocking units 33.

The first sub-blocking portion 31 is positioned in a first blocking layer. The first blocking layer can be made of PI. In one embodiment, the first sub-blocking portion 31 can be made by coating, exposure, development, curing, and etching. A cross-section of the first sub-blocking portion 31 has a trapezoidal shape, wherein the cross-section is taken longitudinally. In order to further prevent the organic layer from overflowing, a bottom angle a1 of the first sub-blocking portion 31 ranges from 30 degrees to 50 degrees. A width of the first sub-blocking portion 31 can be 40 μm. A thickness of the first sub-blocking portion 31 can be 1.5 um.

The second sub-blocking portion 32 can be disposed in a second blocking layer, and the second blocking layer can be made by coating and a UV lamp curing process. In order to further prevent the organic layer from overflowing, a cross-section of the second sub-blocking portion 32 has an inverted trapezoidal shape, wherein a bottom angle a2 of the second sub-blocking portion 32 ranges from 50 degrees to 70 degrees. The second sub-blocking portion 32 is made of a material different from the material of the first sub-blocking portion 31. The second sub-blocking portion 32 partially covers (not completely) the first sub-blocking portion 31, that is, an area of an orthographic projection of the second sub-blocking portion 32 on a base substrate of the display panel is smaller than an area of an orthographic projection of the first sub-blocking portion 31 on the base substrate. In one embodiment, the second sub-blocking portion 32 has a width of 16 μm, and the second sub-blocking portion 32 has a thickness of 1.5 μm.

The blocking unit 33 is disposed on the second sub-blocking portion 32. The second sub-blocking portion 32 is disposed corresponding to the blocking unit 33. In one embodiment for example, each second sub-blocking portion 32 is disposed corresponding to a corresponding one of the blocking units 33. In one embodiment, each second sub-blocking portion 32 is disposed corresponding to at least two blocking units 33. The blocking unit 33 comprises at least two third sub-blocking portions 331. A gap between tops of each adjacent two third sub-blocking portions 331 is smaller than a gap between bottoms of each adjacent two third sub-blocking portions 331. Multiple blocking units 33 partially cover the corresponding second sub-blocking portion 32. That is, an area of an orthographic projection of the multiple blocking units 33 on the base substrate is smaller than an area of an orthographic projection of the corresponding second sub-blocking portion 32 on the base substrate.

In one embodiment, in order to further prevent the organic layer from overflowing, a cross-section of the third sub-blocking portion 331 has an inverted trapezoidal shape. A bottom angle a3 of the third sub-blocking portion 331 ranges from 40 degrees to 60 degrees.

The blocking unit 33 can be positioned in a third blocking layer. The third blocking layer can be made by sequentially performing a coating process and a UV lamp curing process.

According to one embodiment, the third sub-blocking portion 331 has a width of 7 μm, and the third sub-blocking portion 331 has a thickness of 1.5 μm.

In order to improve a blocking effect of the blocking portion, the material of the first sub-blocking portion 31 is different from the material of the second sub-blocking portion 32, and the third sub-blocking portion 331 and the second sub-blocking portion 32 are made of the same material. In order to prevent entry of moisture/water, in one embodiment, the first sub-blocking portion 31 is made of polyimide, and the second sub-blocking portion 32 and the third sub-blocking portion 331 are made of photosensitive resin. The second sub-blocking portion 32 is made of, but is not limited to, oxy-acrylate, polyester acrylate, polyether acrylate, or urethane acrylate.

As shown in FIG. 9, the blocking portion 30 in FIG. 9 comprises four second sub-blocking portions 32 and four blocking units 33, each second sub-blocking portion 32 is disposed corresponding to one blocking unit 33. In order to further prevent the organic layer from overflowing, a gap between tops of each adjacent two second sub-blocking portions 32 is smaller than a gap between bottoms of each adjacent two second sub-blocking portions 32.

Figure 10:
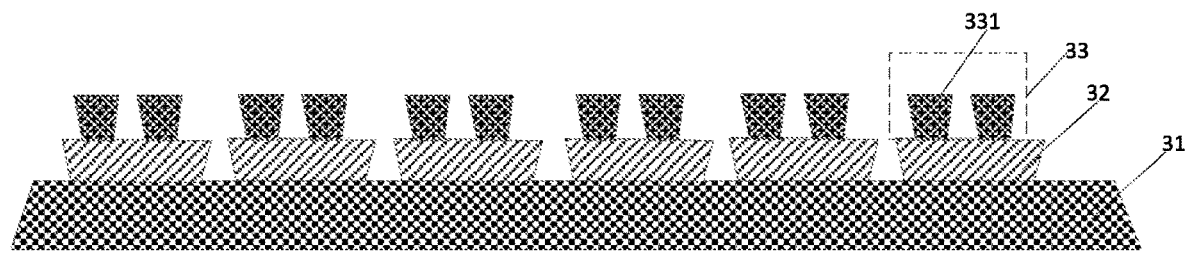
FIG. 10 is a third structural view of the blocking portion of the present invention.

As shown in FIG. 10, the blocking portion 30 in FIG. 10 comprises six second sub-blocking portions 32 and six blocking units 33, each second sub-blocking portion 32 is disposed corresponding to one blocking unit 33. Certainly, the number of the second sub-blocking portions 32 and the number of the blocking units 33 are not limited to the above-listed cases, and may be other numbers. Each of the blocking units 33 may also comprise more than two third sub-blocking portions. The number of the blocking portions is also not limited to the above number.

Since the blocking portion of the present invention comprises three sub-blocking portions, and multiple second sub-blocking portions partially cover the first sub-blocking portion, and multiple blocking units partially cover the respective second sub-blocking portions. A gap between tops of each adjacent two third sub-blocking portions is smaller than a gap between bottoms of each adjacent two third sub-blocking portions, so that a gap at a top of the blocking portion of the present invention is small, and as a result, overflowing of the organic layer can be effectively prevented, an encapsulating effect is improved, and a product lifespan of a display device is prolonged. In addition, such configuration can better prevent water from invading from lateral sides and improve luminous efficiency stability of OLEDs.

The present invention further provides a display module which comprises the above-mentioned display panel.

The present invention further provides an electronic device which comprises the above-mentioned display panel. The electronic device can be a mobile phone, a tablet computer, or etc.

The present invention provides a display panel, a display module, and an electronic device. The present invention comprises at least one blocking portion. A cross-section of the blocking portion comprises: a first sub-blocking portion; at least one second sub-blocking portion, the at least one second sub-blocking portion being disposed on the first sub-blocking portion, the at least one second sub-blocking portion partially covering the first sub-blocking portion; at least one blocking unit, the blocking unit being disposed on the corresponding second sub-blocking portion, the blocking unit comprising at least two third sub-blocking portions, the blocking unit being disposed on the corresponding second sub-blocking portion, wherein the blocking unit partially covers the corresponding second sub-blocking portion, and a gap between tops of each two adjacent third sub-blocking portions is smaller than a gap between bottoms of each two adjacent third sub-blocking portions, so that a gap at a top of the blocking portion of the present invention is small, and thereby overflowing of an organic layer can be effectively prevented, an encapsulating effect is improved, and a product lifespan of the display panel is prolonged.

It is to be understood that equivalent changes and modifications can be made by persons of ordinary skill in the art in accordance with the technical solutions and technical concept of the present invention, and all such changes and modifications are regarded as falling within the scope of the present invention.

What is claimed is:

1. A display panel, comprising:
   at least one blocking portion, the at least one blocking portion surrounding a display region, a cross-section of the blocking portion comprising:
   a first sub-blocking portion;
   at least one second sub-blocking portion, the at least one second sub-blocking portion disposed on the first sub-blocking portion, the at least one second sub-blocking portion partially covering the first sub-blocking portion; and
   a plurality of blocking units, wherein the blocking units are disposed on the at least one second sub-blocking portion, each of the blocking units comprises at least two third sub-blocking portions, at least one of the blocking units is disposed on each of the at least one second sub-blocking portion, the at least one blocking unit partially covers the corresponding second sub-blocking portion, and a gap between tops of each two adjacent third sub-blocking portions is smaller than a gap between bottoms of each two adjacent third sub-blocking portions.

2. The display panel according to claim 1, wherein the blocking portion comprises at least two second sub-blocking portions, a gap between tops of each two adjacent second sub-blocking portions is smaller than a gap between bottoms of each two adjacent second sub-blocking portions.

3. The display panel according to claim 2, wherein a cross-section of the second sub-blocking portion has an inverted trapezoidal shape.

4. The display panel according to claim 3, wherein a bottom angle of the second sub-blocking portion ranges from 50 degrees to 70 degrees.

5. The display panel according to claim 1, wherein a cross-section of the third sub-blocking portion has an inverted trapezoidal shape.

6. The display panel according to claim 5, wherein a bottom angle of the third sub-blocking portion ranges from 40 degrees to 60 degrees.

7. The display panel according to claim 1, wherein the first sub-blocking portion is made of a material different from a material of the second sub-blocking portion, and the third sub-blocking portion is made of a material same as the material of the second sub-blocking portion.

8. The display panel according to claim 7, wherein the first sub-blocking portion is made of polyimide, and the second sub-blocking portion and the third sub-blocking portion are both made of photosensitive resin.

9. The display panel according to claim 7, wherein a material of the second sub-blocking portion comprises oxyacrylate, polyester acrylate, polyether acrylate, and urethane acrylate.

10. The display panel according to claim 1, wherein a cross-section of the first sub-blocking portion has a trapezoidal shape.

11. The display panel according to claim 10, wherein a bottom angle of the first sub-blocking portion ranges from 30 degrees to 50 degrees.

12. A display module, the display module comprising a display panel, the display module comprising:
   at least one blocking portion, the at least one blocking portion surrounding a display region,
   a cross-section of the blocking portion comprising:
      a first sub-blocking portion;
      at least one second sub-blocking portion, the at least one second sub-blocking portion disposed on the first sub-blocking portion, the at least one second sub-blocking portion partially covering the first sub-blocking portion; and
      a plurality of blocking units, wherein the blocking units are disposed on the at least one second sub-blocking portion, each of the blocking units comprises at least two third sub-blocking portions, at least one of the blocking units is disposed on each of the at least one second sub-blocking portion, the at least one blocking unit partially covers the corresponding second sub-blocking portion, and a gap between tops of each two adjacent third sub-blocking portions is smaller than a gap between each two adjacent third sub-blocking portions.

13. The display module according to claim 12, wherein the blocking portion comprises at least two second sub-blocking portions, a gap between tops of each two adjacent second sub-blocking portions is smaller than a gap between bottoms of each two adjacent second sub-blocking portions.

14. The display module according to claim 13, wherein a cross-section of the second sub-blocking portion has an inverted trapezoidal shape.

15. The display module according to claim 14, wherein a bottom angle of the second sub-blocking portion ranges from 50 degrees to 70 degrees.

16. The display module according to claim 12, wherein a cross-section of the third sub-blocking portion has an inverted trapezoidal shape.

17. The display module according to claim 16, wherein a bottom angle of the third sub-blocking portion ranges from 40 degrees to 60 degrees.

18. The display module according to claim 12, wherein the first sub-blocking portion is made of a material different from a material of the second sub-blocking portion, and the third sub-blocking portion is made of a material same as the material of the second sub-blocking portion.

19. The display module according to claim 18, wherein the first sub-blocking portion is made of polyimide, and the second sub-blocking portion and the third sub-blocking portion are both made of photosensitive resin.

20. An electronic device, the electronic device comprising a display module, the display module comprising a display panel, the electronic device comprising:
   at least one blocking portion, the at least one blocking portion surrounding a display region, a cross-section of the blocking portion comprising:
      a first sub-blocking portion;
      at least one second sub-blocking portion, the at least one second sub-blocking portion disposed on the first sub-blocking portion, the at least one second sub-blocking portion partially covering the first sub-blocking portion; and
      a plurality of blocking units, wherein the blocking units are disposed on the at least one second sub-blocking portion, each of the blocking units comprises at least two third sub-blocking portions, at least one of the blocking units is disposed on each of the at least one second sub-blocking portion, the at least one blocking unit partially covers the corresponding second sub-blocking portion, and a gap between tops of each two adjacent third sub-blocking portions is smaller than a gap between bottoms of each two adjacent third sub-blocking portions.

* * * * *